United States Patent
Atkinson

(10) Patent No.: US 6,586,967 B2
(45) Date of Patent: Jul. 1, 2003

(54) INTEGRATED CIRCUIT DEVICE HAVING DATA SIGNAL OUTPUT AT VOLTAGE LEVEL OF THE DEVICE COUPLED THERETO

(75) Inventor: Christopher Atkinson, Dunstable (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/996,067

(22) Filed: Nov. 28, 2001

(65) Prior Publication Data

US 2002/0093371 A1 Jul. 18, 2002

(30) Foreign Application Priority Data

Nov. 29, 2000 (GB) .............................................. 0029162

(51) Int. Cl.[7] ......................................... H03K 19/0175
(52) U.S. Cl. ............................. 326/80; 326/81; 326/56; 326/63
(58) Field of Search .............................. 326/80, 81, 56, 326/57, 58, 63

(56) References Cited

U.S. PATENT DOCUMENTS 5,521,531 A * 5/1996 Okuzumi ..................... 326/81
5,689,202 A 11/1997 Ranson
5,973,521 A 10/1999 Kim et al.
6,124,732 A 9/2000 Zilic et al.
6,208,167 B1 * 3/2001 Ranjan et al. ................. 326/81

FOREIGN PATENT DOCUMENTS

WO 9820612 5/1998

* cited by examiner

*Primary Examiner*—Daniel Chang
(74) *Attorney, Agent, or Firm*—Ware, Fressola, Van Der Sluys & Adolphson LLP

(57) ABSTRACT

An integrated circuit device 1 such as a current sensor includes a circuit configuration 3 which is driven from supply rails (P1, P2) at a given operational voltage. The integrated circuit device 1 includes control circuitry (R1, T1) responsive to an enabling signal from a micro-controller 2 applied to pin P8 to ensure that data supplied at pin P7 to the micro-controller is at a voltage compatible with a running voltage of the micro-controller 2 that is different from that of the device 1. No pin to receive a rail voltage corresponding to the running voltage for the micro-controller 2 is needed for the integrated circuit device 1.

16 Claims, 2 Drawing Sheets

INTEGRATED CIRCUIT DEVICE HAVING DATA SIGNAL OUTPUT AT VOLTAGE LEVEL OF THE DEVICE COUPLED THERETO

DESCRIPTION

Field of the Invention

This invention relates to an integrated circuit device for use in an electrical circuit in which data is supplied to another device which may operate at a different voltage.

BACKGROUND

Conventional integrated circuit devices operate with different rail and input/output voltages, and special steps need to be taken to connect them to one another when different rail voltages are used for the individual devices. For example, in a mobile telephone handset, the major telephony functions are controlled by a micro-controller, which is driven by a power supply at a predetermined rail voltage e.g. 1.8 v. The power supply is driven by a rechargeable battery in the handset. Conventionally, the level of charge in the battery is monitored by a current sensor that comprises an integrated circuit which feeds data to the controlling microprocessor. The current sensing integrated circuit is typically driven by the voltage of the battery, which is different from the supply rails for the controlling microprocessor. Nevertheless, the current sensor integrated circuit needs to supply its data to the controlling microprocessor at a voltage compatible with the input/output voltage used by the microprocessor.

One approach used hitherto has been to provide a connection pin on the current sensor integrated circuit to receive a rail voltage supplied by the controlling microprocessor. The integrated circuit uses the voltage applied to the pin so as to configure its data output supplied to the controlling microprocessor, to be at a voltage corresponding to the input/output voltage for the microprocessor. Additionally, the current sensor integrated circuit includes an enable pin which receives an enabling signal from the microprocessor to control its operation, i.e. to enable it to produce data corresponding to the condition of the battery. Thus, the current sensor integrated circuit can use its own supply rails, at a different voltage from the controlling microprocessor, yet produce a data output compatible with the microprocessor.

A problem with this approach is that the number of pins needed increases the overall size of the integrated circuit package and undesirably uses up space in the handset. This problem occurs not only in relation to the current sensor integrated circuit but also other situations in which communication occurs between integrated circuits that operate with different rail voltages.

SUMMARY OF THE INVENTION

The present invention seeks a solution to this problem. According to the invention there is provided an integrated circuit device including: a circuit configuration to be driven from supply rails at a given operational voltage, pins for connection to supply rails for the device to receive said operational voltage, a data pin to supply data to another device that may operate at a running voltage different from said operational voltage for the device, an enable pin to receive an enabling signal from the other device at the running voltage thereof, the circuit configuration being enabled to supply data for the other device to the data input pin in response to the enabling signal applied to the enable pin, and control circuitry responsive to the enabling signal to control the voltage of the data fed by the circuit configuration to the data pin to be compatible with the running voltage of the other device.

The control circuitry may comprise an impedance coupled between the enable pin and the data pin, and a switch operable to connect the data pin to one of the rails so as to move the voltage of the data pin in accordance with said data between a voltage corresponding to the voltage at the enable pin and the voltage of said one of the rails.

Alternatively, the control circuitry may comprise a gate configured to supply the data to the data pin, the gate being controlled in accordance with the voltage at the enable pin.

Thus, in accordance with the invention, there is no need to provide a pin to receive the rail voltage corresponding to the running voltage from the other device, since the integrated circuit device includes control circuitry responsive to the enabling signal so as to control the voltage of the data fed by the circuit configuration, to be compatible with the running voltage of the other device.

The invention has particular although not exclusive application to battery driven telecommunications apparatus such as a mobile telephone handset in which the integrated circuit device comprises a battery sensor for providing data relating to the level of charge of the battery, and the other device comprises a controlling micro-controller for controlling telecommunications functions.

BRIEF DESCRIPTION OF THE DRAWINGS

In order that the invention may be more fully understood an embodiment thereof will now be described by way of example with reference to the accompanying drawings in which.

DETAILED DESCRIPTION

Figure 1:
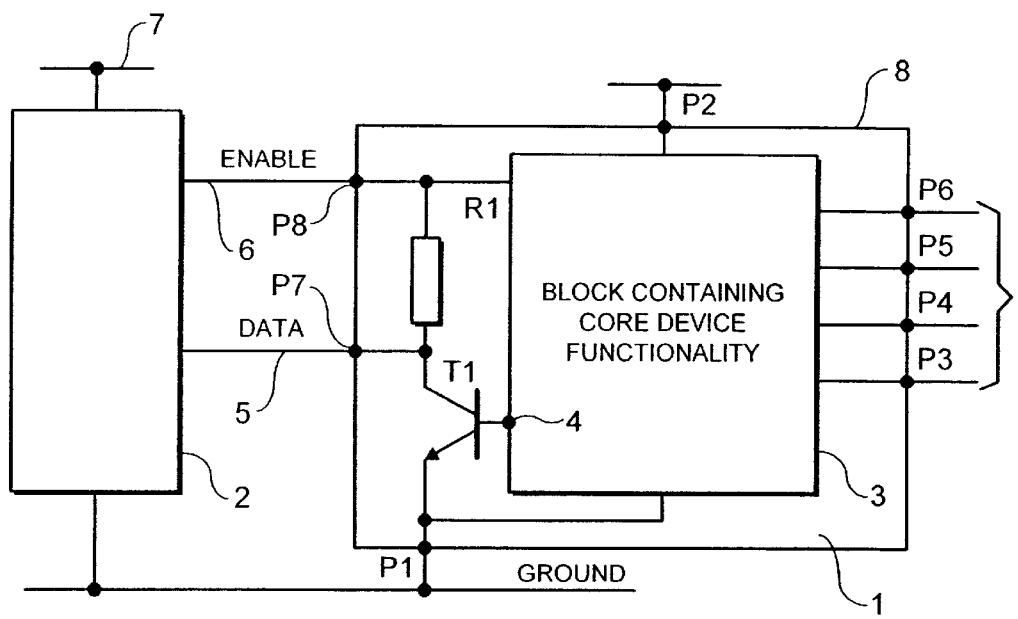
FIG. 1 is a schematic block diagram of a simple example of an electrical circuit incorporating an integrated circuit device according to the invention.

FIG. 1 illustrates a simple example of the invention. An eight pin integrated circuit device 1 provides data to another device 2 in the form of a controlling micro-controller 2. The integrated circuit device 1 has pins P1, P2 that are connected to supply rails for the device. As shown in FIG. 1, pin P1 is connected to ground whereas pin P2 is connected to a supply voltage rail at e.g. 1.8 v.

The device 1 includes a circuit configuration 3 that contains the core functionality of the device. For example, the integrated circuit may be configured to derive data corresponding to the level of charge of a battery or may be used for other functions, e.g. for monitoring a gas sensor or other remote sensor applications. Thus, signals may be supplied to and from the remote sensor or device being monitored through pins P3–P6. Data corresponding to the battery charge level or other monitored function is produced by the circuit configuration 3 at terminal 4 and is supplied to a data pin P7 so as to be applied to data line 5, to the controlling micro-controller 2.

The micro-controller 2 can request data from the integrated circuit device 1 by applying an enabling signal over line 6 to an enable pin P8.

An impedance in the form of a resistor R1 is connected between the enable pin P8 and the data pin P7 and a switch in the form of transistor T1 is connected between the data pin P7 and the ground pin P1. The control electrode of transistor T1 is connected to the data output terminal 4.

The controlling micro-controller 2 is connected between the ground supply rail and its own running voltage supply rail 7 e.g. at 3 volts, which is different from the supply rail of 1.8 v connected to pin P2. Typically, the controlling micro-controller is configured to operate with input/output signals which switch between 0 v and 3 v i.e. corresponding to the voltage applied to supply rail 7. However, the voltages developed at terminal 4 are based on the supply voltage applied at pin P2 namely 1.8 v. It will be understood that the signals at terminal 4 are digital e.g. pulse width modulated signals. The resistor R1 and transistor T1 act as control circuitry to convert the voltage at terminal T4 so that when applied to the data pin P7, the signals are at a voltage compatible with the running voltage of the controlling micro-controller 2. This is achieved according to the invention, without the provision of a rail voltage supply from the controlling micro-controller 2 being fed to a separate pin on the integrated circuit device 1.

In more detail, when the controlling micro-controller 2 requests data from the integrated circuit device 1, an enable signal is applied on line 6 to enable pin P8. The circuit configuration 3 is responsive to the occurrence of the enable signal to develop data at terminal 4 50 that the integrated circuit device 1 can respond to the request from the controlling micro-controller 2. The enable signal on line 6 is at the input/output voltage of the micro-controller 2 namely 3v in this example. The resistor R1 and transistor T1 act as control circuitry so that as the transistor Ti is switched on and off respectively in accordance with the data developed at terminal 4 at 1.8v, so that the voltage at terminal P7 is switched between ground and the voltage at P8, namely the voltage of the enabling signal, 3v in this example. Thus, the data is supplied to terminal P7 at a voltage compatible with the running voltage of the controlling micro-controller 2.

It will be appreciated that in this arrangement, the voltage developed at terminal P7 can be greater or less than the supply voltage applied to terminal P2 for the integrated circuit device 1. The voltage of the data developed on line 5 is thus automatically selected in dependence upon the voltage of the enabling signal on line 6. Thus, the control circuitry will operate with different controlling micro-controllers that operate at different supply voltages, without modification.

The circuitry within the device 1 is encapsulated within a housing 8 and the pins P1–P8 form external connections which extend through the housing in a conventional manner. Thus, the described circuit configuration avoids the need for an additional pin to receive a rail voltage from the controlling microprocessor 2, thereby reducing the number of pins needed. It will be understood that if more than eight pins are required, the footprint of the integrated circuit device is increased substantially, increasing the footprint of the device, and so the invention permits the number of pins in this example to be eight or less.

The invention has particular application to battery driven portable telecommunications apparatus such as a mobile telephone handset, in which the integrated circuit is used to monitor the charge level of the battery and an example of such a device will now be described schematically with reference to FIGS. 2 and 3.

Figure 2:
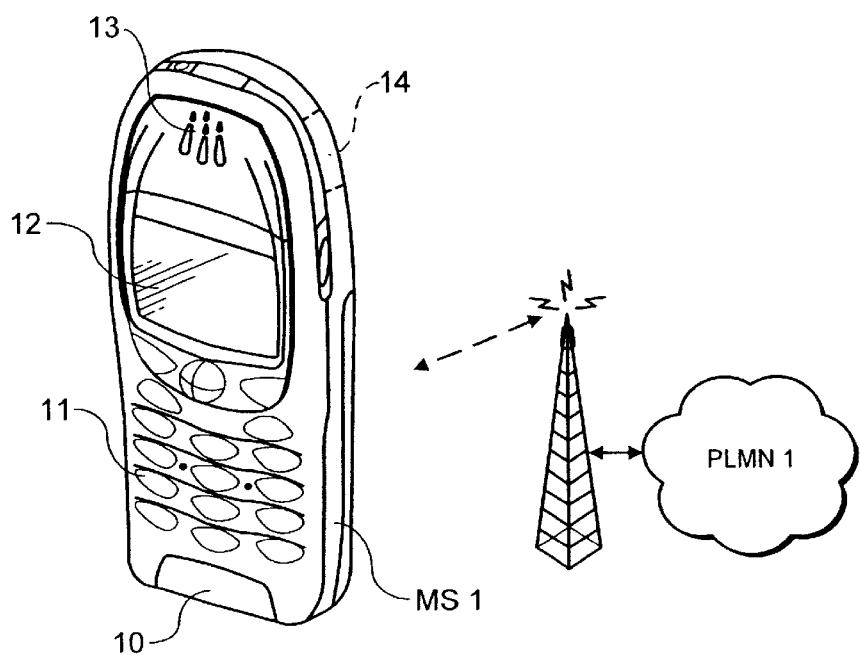
FIG. 2 is a schematic diagram of a mobile telephone handset.

In FIG. 2, a mobile station in the form of a battery driven telephone cellular handset MS1, is shown schematically in radio communication with PLMN 1. The mobile handset MS1 includes a microphone 10, keypad 11, a liquid crystal display (LCD) device 12, ear-piece 13 and internal antenna 14.

Figure 3:
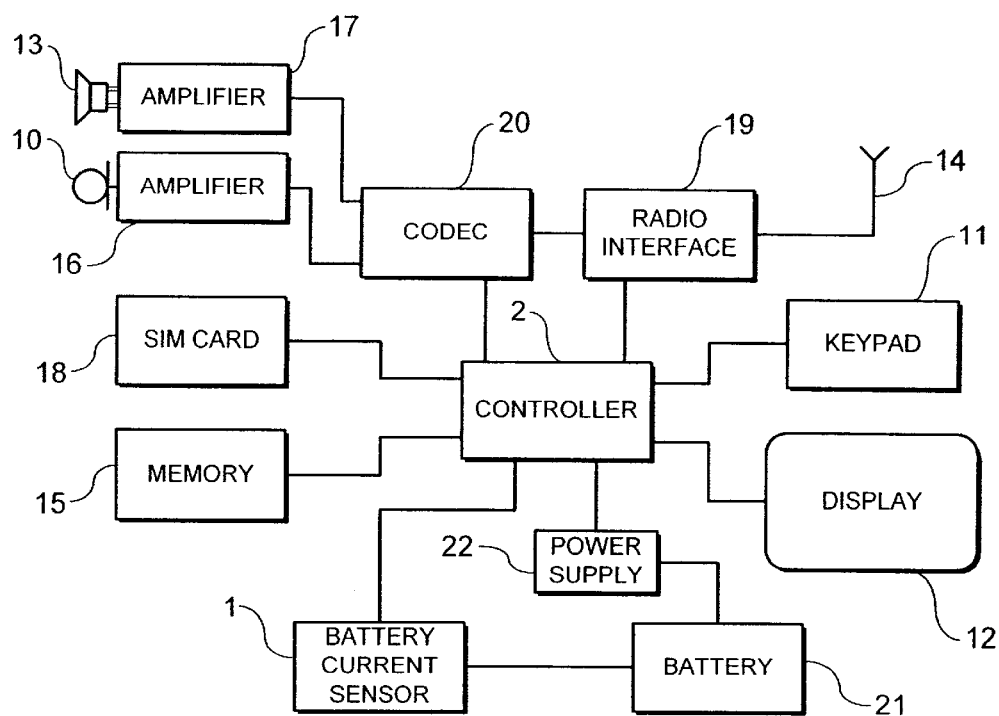
FIG. 3 is a schematic block diagram of the electrical circuitry within the handset that incorporates an example of a device according to the invention.

The circuitry of the handset MS 1 is shown in more detail in FIG. 3. Signal processing is carried out under the control of the digital micro-controller 2 which has an associated memory 15. Electrical analogue audio signals are produced by microphone 10 and amplified by pre-amplifier 16. Similarly, analogue audio signals are fed to the ear-piece 13 through an amplifier 17. The micro-controller 2 receives instruction signals from the keypad 11 and controls operation of the LCD display 12.

Information concerning the identity of the user is held on a smart card 18 in the form of a GSM SIM card which contains the usual GSM international mobile subscriber identity and encryption K; that is used for encoding the radio transmission in a manner well known per se. Radio signals are transmitted and received by means of the antenna 14 connected through a r.f. stage 19 to a codec 20 configured to process signals under the control of the micro-controller 2. Thus, in use, for speech, the codec 20 receives analogue signals from the microphone amplifier 16, digitises them into a form suitable for transmission and feeds them to the rf stage 19 for transmission through antenna 14 to PLMN 1 shown in FIG. 2. Similarly, signals received from PLMN 1 are fed through the antenna 14 to be demodulated by the rf stage 19 and fed to codec 20 so as to produce analogue signals fed to amplifier 17 and ear-piece 13.

The handset MS 1 is driven by a rechargeable battery 21 with a nominal voltage of 3.8 volts in this example. The charge level of the battery 21 is sensed by the integrated circuit device 1 in the manner explained with reference to FIG. 1 and the integrated circuit device 1 itself receives its operating rail voltage from the battery, of 3.8 volts. The micro-controller 2 is driven by a power supply 22 which is driven from the battery 21 and provides the running voltage for the micro-controller 2. In this example, the running voltage is 1.8 volts. As the battery discharges, its voltage decreases whereas the output of the power supply remains constant for the operational battery voltage range. Thus, the operating voltage for the integrated circuit device 1 decreases whereas the running voltage for the micro-controller remains constant. The circuitry shown in FIG. 1 will operate satisfactorily under these circumstances and the voltage on the data line 5 shown in FIG. 1 will remain compatible with the input/output voltage requirements of the micro-controller 2 notwithstanding the decrease in rail voltage for the integrated circuit device 1.

Figure 4:
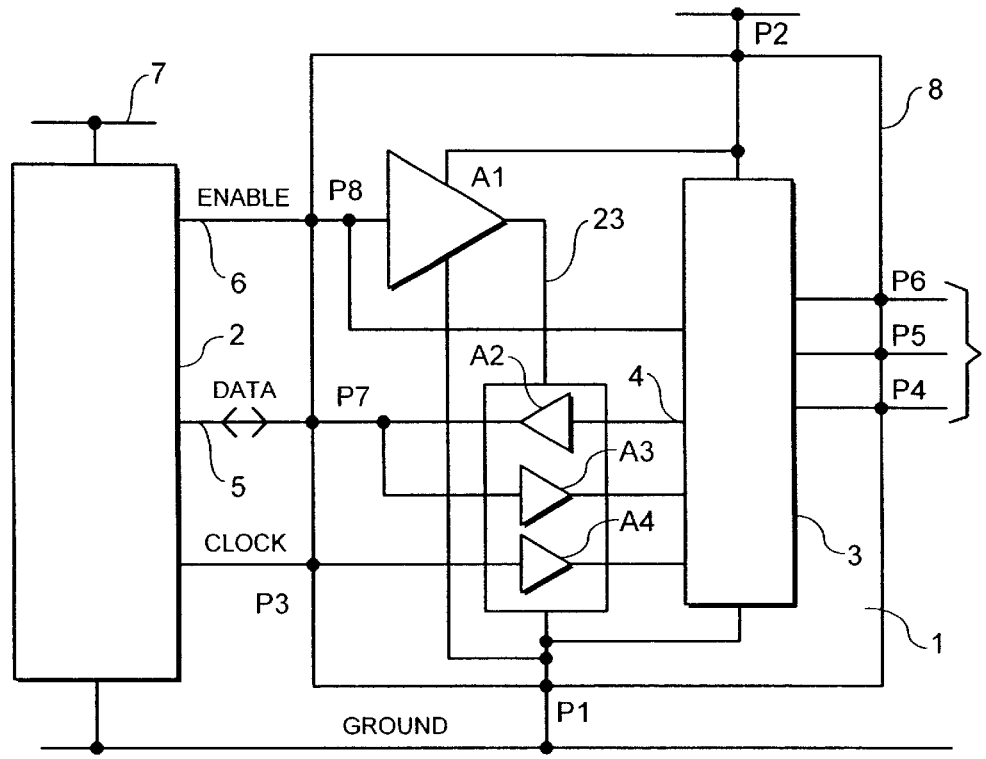
FIG. 4 is a schematic block diagram of another example of an electrical circuit incorporating an integrated circuit device according to the invention.

An alternative, more advanced implementation of a device in accordance with the invention is shown in FIG. 4. Like parts are marked with the same reference numbers to those in FIG. 1. In this example, the integrated circuit device 1 receives a supply voltage at terminal P2 of 5 v and the controlling micro-controller receives a running voltage of 1.8 v at supply rail 7. In this example, the enable signal on line 6 applied to enable pin P8 is, in addition to be supplied to circuit configuration 3, also supplied to a voltage follower amplifier A1 which produces an output on line 23 that is fed to gates A2, A3 and A4 each of which corresponds to R1 and T1 as shown in FIG. 1. Gate A2 acts as control circuitry so as to apply data signals at terminal 4 from the circuit configuration 3, to data pin P7. Since the voltage output of A2 is controlled by amplifier A1 in accordance with the voltage at pin P8, the voltage at pin P7 corresponds to the voltage at P8 i.e. is compatible with the running voltage of the controlling micro-controller 7.

In this example, the data line 5 is configured for bi-directional data flow and data received by circuit 1 at pin P7 from controller 2, is applied as an input to gate A3. Thus, the voltage at pin P7, which is compatible with the input/output voltages for circuit 2, is converted to a voltage level compatible with the operational voltage for the circuit configuration 3 namely 5 v in this example.

In the embodiment of FIG. 4, the pin P3 receives clock pulses from the controlling micro-controller 2. The clock pulses are thus at a voltage corresponding to the input/output voltage for micro-controller 2, namely 1.8 v. Gate A4 is connected to pin P3 and is operative to increase the voltage of the clock pulses received at pin P3 to a corresponding voltage for the circuit configuration 3, namely 5 v.

Many modifications and variations fall within the scope of the claimed invention. For example, the invention can be used not only for battery charge sensing but also for other sensing devices such as gas sensors or optical sensors. Thus, whilst the invention has been described in the context of mobile telecommunications apparatus such as mobile telephone handsets, it can also be used in other portable electronic apparatus such as PDAs, portable gas sensors and the like.

What is claimed is:

1. An integrated circuit device comprising:
   a circuit configuration to be driven from supply rails at a given operational voltage, pins for connection to supply rails for the device to receive said operational voltage, a data pin to supply data to another device that may operate at a running voltage different from said operational voltage, an enable pin to receive an enabling signal from the other device at the running voltage thereof, the circuit configuration being enabled to supply data for the other device to the data pin in response to the enabling signal applied to the enable pin, and control circuitry responsive to the enabling signal to control the voltage of the data fed by the circuit configuration to the data pin at the voltage of the enable pin to be compatible with the running voltage of the other device.

2. An integrated circuit device according to claim 1 wherein the control circuitry comprises an impedance coupled between the enable pin and the data pin, and a switch operable to connect the data pin to one of the rails so as to move the voltage of the data pin in accordance with said data between a voltage corresponding to the voltage at the enable pin and the voltage of said one of the rails.

3. An integrated circuit device according to claim 2 wherein said one of the rails comprises a ground rail.

4. An integrated circuit device according to claim 1 wherein the control circuitry includes a gate configured to supply the data to the data pin, the gate being controlled in accordance with the voltage at the enable pin.

5. An integrated circuit device according to claim 4 including a further gate configured to receive data from the data pin whereby to receive data from the other device to be supplied to the circuit configuration, the further gate being controlled in accordance with the voltage at the enable pin.

6. An integrated circuit device according to claim 4 including a further pin to receive a further signal from the other device and a further gate to supply the further signal in accordance with the voltage at the enable pin.

7. An integrated circuit device according to claim 6 wherein said further pin comprises a clock pin to receive a clock signal.

8. An integrated circuit device according to claim 6 including a voltage follower circuit coupled to the enable pin, configured to control the or each said gate.

9. An integrated circuit according to claim 1 wherein circuit configuration is encapsulated in a housing and the pins protrude from the housing to permit external connections to be made thereto.

10. An integrated circuit according to claim 1 with eight pins or less.

11. An electrical circuit including an integrated circuit device, said integrated circuit device comprising:
    a circuit configuration to be driven from supply rails at a given operational voltage, pins for connection to supply rails for the device to receive said operational voltage, a data pin to supply data to another device that may operate at a running voltage different from said operational voltage, an enable pin to receive an enabling signal from said other device at the running voltage thereof, the circuit configuration being enabled to supply data for said other device to the data input in response to the enabling signal applied to the enable pin, and control circuitry responsive to the enabling signal to control the voltage of the data fed by the circuit configuration to the data pin at the voltage of the enable pin to be compatible with the running voltage of said other device, and said other device connected to said integrated circuit device.

12. The electrical circuit according to claim 11 wherein said other device further comprises a microprocessor for controlling the operation of said integrated circuit device.

13. The electrical circuit according to claim 12 wherein said integrated circuit device and said other device have a common first supply rail and respective second supply rails configured to be driven at different voltages.

14. An integrated circuit device comprising a circuit configuration to be driven from supply rails at a given operational voltage, external connections for receiving the operational voltage from the supply rails, an external data connection for supplying data to another device that may operate at a running voltage different from the operational voltage, and an enable connection to receive an enabling signal from the other device at the running voltage thereof, the circuit configuration being enabled for operation so as to supply data for the other device to the data connection selectively in response to the enabling signal being applied to the enable connection, wherein there is no external connection to receive a continuous rail voltage corresponding to the running voltage from the other device, and the integrated circuit device includes control circuitry responsive to the enabling signal applied to the enable connection to control the voltage of data fed by the circuit configuration to the data connection to be compatible with the running voltage of the other device.

15. A portable electronic apparatus including an electrical circuit having an integrated circuit device wherein said integrated circuit device further comprises:
    a circuit configuration to be driven from supply rails at a given operational voltage, pins for connection to supply rails for the device to receive said operational voltage, a data pin to supply data to another device that may operate at a running voltage different from said operational voltage, an enable pin to receive an enabling signal from said other device at the running voltage thereof, the circuit configuration being enabled to supply data for said other device to the data pin in response to the enabling signal applied to the enable pin, and control circuitry responsive to the enabling signal to control the voltage of the data fed by the circuit configuration to the data pin at the voltage of the enable pin to be compatible with the running voltage of said other device, and said other device connected to said integrated circuit device.

16. The portable electronic apparatus according to claim 15 further comprising a battery driven telecommunications apparatus wherein said integrated circuit device comprises a battery sensor for providing data relating to the level of charge of the battery, and said other device comprises a controlling microcontroller for controlling telecommunications functions.

* * * * *

UNITED STATES PATENT AND TRADEMARK OFFICE
CERTIFICATE OF CORRECTION

PATENT NO. : 6,586,967 B2 Page 1 of 1
DATED : July 1, 2003
INVENTOR(S) : Christopher Atkinson It is certified that error appears in the above-identified patent and that said Letters Patent is hereby corrected as shown below:

Column 3,
Line 33, "50" should be -- so --.
Line 38, "Ti" should be -- T1 --.

Column 4,
Line 23, "K;" should be -- $K_i$ --.

Signed and Sealed this

Fourteenth Day of October, 2003

JAMES E. ROGAN
*Director of the United States Patent and Trademark Office*